United States Patent [19]

Spiesman et al.

[11] Patent Number: 4,788,605
[45] Date of Patent: Nov. 29, 1988

[54] RECEIVE MANCHESTER CLOCK CIRCUIT

[75] Inventors: Robert L. Spiesman, Phoenix; Burke B. Baumann, Glendale, both of Ariz.

[73] Assignee: Honeywell Inc., Minneapolis, Minn.

[21] Appl. No.: 31,957

[22] Filed: Mar. 30, 1987

[51] Int. Cl.$^4$ .............................................. G11B 5/09
[52] U.S. Cl. ......................................... 360/42; 300/51
[58] Field of Search ............... 360/42, 51, 43; 375/82, 375/57, 110

[56] References Cited

U.S. PATENT DOCUMENTS 4,320,525  3/1982  Woodward .......................... 360/42
4,542,420  9/1975  Kozlik et al. ........................ 360/42

Primary Examiner—Vincent P. Canney
Attorney, Agent, or Firm—A. A. Sapelli; D. J. Lenkszus; A. Medved

[57] ABSTRACT

A circuit for producing a receive Manchester clock from serially received Manchester encoded data signals. The encoded data signals are differentiated to produce a primary clock pulse for each voltage transition of the applied signals. Each primary clock pulse is delayed a predetermined period of time to produce secondary clock pulse and each secondary clock pulse is delayed for substantially the same period of time to produce a tertiary clock pulse. The primary, secondary and tertiary clock pulses are applied to a gate which produces a receive Manchester clock pulse when a primary, secondary, or tertiary clock pulse is applied to the gate. The frequency of the receive Manchester clock is twice that of the basic frequency of the received Manchester encoded data signals.

2 Claims, 1 Drawing Sheet

RECEIVE MANCHESTER CLOCK CIRCUIT

CROSS REFERENCE TO RELATED APPLICATION

The following co-pending concurrently filed application relates to the invention of the present application and is incorporated herein by reference.

Bidirectional Repeater for Manchester Encoded Data Signals by R. L. Spiesman and T. J. Kozlik application Ser. No. 031,965, filed Mar. 30, 1987.

The above identified application and this application are assigned to Honeywell Inc., a Delaware Corporation.

BACKGROUND OF THE INVENTION

1. Field of the Invention

This invention is in the field of circuits for producing a receive Manchester clock from received Manchester encoded data signals.

2. Background Art

The most relevant related art known to applicants is a receive clock derivation circuit for producing a receive clock from received Manchester encoded data (MED) signals which is found in U.S. Pat. No. 4,542,420 which issued on Sept. 17, 1985 to T. J. Kozlik and R. L. Spiesman.

In the Kozlik et al patent received Manchester encoded data signals are differentiated to produce primary pulses. The primary pulses are applied to a delay line oscillator which produces a decode clock. The decode clock and primary pulses are applied to a shift register. Selected outputs of the shift register are applied to a logic circuit which produces the receive Manchester clock. The receive Manchester clock is then used to decode the received Manchester encoded data signals.

PRIOR ART STATEMENT

The following reference is submitted under the provisions of 37 CFR 1.97(b):

U.S. Pat. No. 4,452,420, dated Sept. 17, 1985 by T. J. Kozlik and Robert L. Spiesman.

Kozlik et al teaches a prior art receive Manchester clock circuit.

SUMMARY OF THE INVENTION

The binary data of a signal representing a Manchester bit cell, which data is transmitted serially, is determined by the direction, or polarity, of the voltage transition, the mid-bit transition, which occurs between the two half bit cells of a valid Manchester bit cell. Typically, if the voltage level of a Manchester bit cell represents a logic 1 in the first half bit cell and the voltage level in the second half bit cell represents a logic 0, then the informational content of the Manchester bit cell is defined as being a logic 1. Concomitantly, if the voltage level in the first half-bit cell represents a logic 0 and that of the second half-bit cell a logic 1, then the informational content of the Manchester bit cell is defined as being a logic 0. If the voltage levels in the two half-bit cells of a given Manchester bit cell are the same; i.e., either both are logic 0s or both are logic 1s, then the informational content of the Manchester bit cell is defined as being a code violation (CV).

The receive Manchester clock circuit of this invention produces a primary clock pulse having a predetermined pulse width at each voltage transition of the received Manchester encoded data signals applied to it. Each primary pulse is applied to a first delay line circuit which produces a secondary clock pulse which is delayed a predetermined period of time after each primary pulse is produced. Each secondary pulse is applied to a second delay line which produces a tertiary clock pulse which is delayed a predetermined period of time after each secondary pulse is produced. The periods of delay are substantially the same. The primary, secondary and tertiary pulses are applied to a logic circuit so that a receive Manchester clock pulse is produced by the gate even when the received MED signals include two Manchester bit cells that do not include a mid-bit voltage transition, or two code violations. Stated another way, receive Manchester clock pulses are produced even when no primary clock pulse is applied to the circuit of this invention for up to three Manchester clock periods. As a result, the receive Manchester clock circuit of this invention is well adapted to produce a receive Manchester clock even when the received MED signals intentionally include Manchester code violations. In addition, the receive Manchester clock produced by the receive Manchester clock circuit of this invention can be the source of the reference frequency applied to a phase lock oscillator to produce a reconstituted Manchester clock in which minor variations in the pulse widths or periods of the receive Manchester clock are substantially eliminated.

It is therefore an object of this invention to provide an improved receive Manchester clock circuit.

It is another object of this invention to provide an improved receive Manchester clock circuit for received Manchester encoded data signals that include two adjacent Manchester bit cells with no mid-bit voltage transition.

It is yet another object of this invention to provide an improved receive Manchester clock circuit the output of which is adapted to be the source of the reference frequency applied to a phase locked loop oscillator.

BRIEF DESCRIPTION OF THE DRAWINGS

Other objects, features, and advantages of the invention will be readily apparent from the following description of certain preferred embodiments thereof, taken in conjunction with accompanying drawings, although variations and modifications may be effected without departing from the spirit and scope of the novel concepts of the disclosure, and in which.

DETAILED DESCRIPTION OF THE INVENTION

Figure 1:
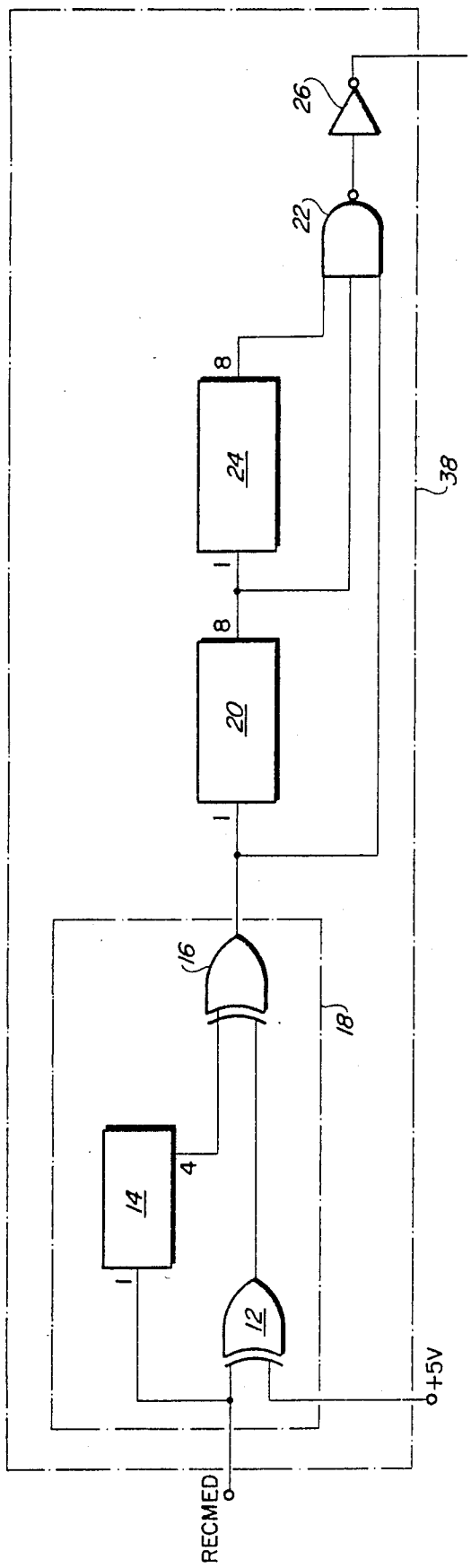
FIG. 1 is a schematic block diagram of the receive Manchester clock circuit of this invention.

In FIG. 1, receive Manchester clock circuit 10 has applied to it received Manchester encoded data signals identified as RECMED on FIG. 1. In FIG. 2A, the wave forms of received Manchester encoded data signals representing information transmitted between modules of a token passing network of a plant management system such as is described and claimed in U.S. Pat. No. 4,607,256, dated Aug. 19, 1986 are illustrated. The information so transmitted is organized into frames with each frame including a series of bytes of a preamble consisting of MED signals of the same type representing a logic one, for example. The preamble is follows by a start of frame delimiter of one byte, other elements of a frame which are not illustrated in FIG. 2A, and at the end of the frame, an end of frame delimiter of one byte is present. Manchester encoding requires that there always be a voltage transition in the middle of each valid Manchester bit cell. If there is no such transition, a code violation, CV occurs. Both start and end of frame delimiters include code violations, four CVs each.

Figure 2:
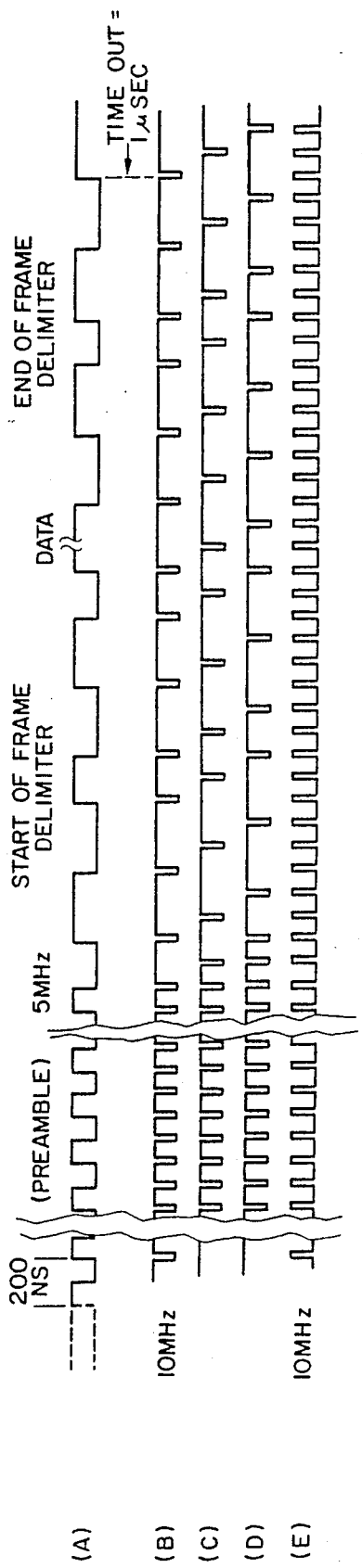
FIGS. 2 (A-E) illustrate typical wave forms useful in describing he operation of this invention.

As can be best seen from FIG. 2, the received Manchester encoded data (RECMED) is nonrepetitive, and therefore, not suitable for synchronizing the output of a phase locked loop oscillator. The received MED signals have three different periods, or frequencies. The basic frequency of the MED signals is in the preferred embodiment 5.0 MHz, with the period between voltage transitions being 100 nanosecond if the received MED signals are all logical ones or logical zeroes, and 200 nanoseconds if the received MED signals alternate between ones and zeroes. In the start of frame and end of frame delimiters, the maximum period between voltage transitions associated with two CVs is 300 nanoseconds.

The RECMED signal is applied to one input terminal of exclusive OR gate 12. The other input terminal of gate 12 is attached to a source of +5 V. D.C. which represents a logic one or HIGH. The RECMED signal is also applied to the input terminal of delay line 14. The output of gate 12 is one input to exclusive OR gate 16. The other input to gate 16 is the output at pin 4 of delay line 14. In the preferred embodiment, the output of delay line 14 applied to gate 16 is the RECMED signal delayed by 40 nanoseconds. Gates 12 and 16 and delay line 14 form differentiator 18 which produces a 40 nanosecond wide negative going pulse for each voltage transition of the received MED signals applied to differentiator 18. FIG. 2B illustrates the wave forms of the signals produced by differentiator circuit 18.

The primary clock signals, the result of differentiating the received MED signals and the output of differentiation circuit 18 are applied to a second delay line 20 and to one input terminal of three input NAND gate 22. The output of delay line 20 is a secondary clock with each secondary clock pulse being delayed 100 nanoseconds with respect to its associated primary clock pulse. Each secondary pulse is applied to a second input terminal of NAND gate 22 and to a third delay line 24. FIG. 2C illustrates the wave forms of the secondary clock pulses produced by delay line 20. The output of delay line 24 is a tertiary clock which is delayed 100 nanoseconds with respect to the associated secondary clock and 200 nanoseconds with respect to its associated primary clock pulse. Each tertiary clock pulse is applied to the third input terminal of gate 22. The wave forms of the tertiary clock are illustrated in FIG. 2D. Gate 22 combines the primary, secondary and tertiary clocks to produce a negative pulse whenever a primary, a secondary or a tertiary clock pulse is applied to its input terminals, with the pulses produced by gate 22 being the receive Manchester clock. In the preferred embodiment, the receive Manchester clock circuit 10 produces a positive going receive Manchester clock. To accomplish this, the output of gate 22 is inverted by inverter 26.

In FIG. 2E, the wave form of the output of circuit 10 at the output of gate 22 is illustrated, the receive Manchester clock for the received ME signals applied to circuit 10's input terminal 28. It should be noted that the spacing, or period, between clock pulses of the receive Manchester clock are substantially the same, 100 nanoseconds in the preferred embodiment which corresponds to a frequency of 10 MHz, twice the basic frequency of the applied RECMED signals.

Because for each primary clock produced by discriminator circuit 18 a secondary clock is produced 100 nanoseconds later and a tertiary clock pulse is produced 200 nanoseconds later, circuit 10 produces a Manchester receive clock pulse every 100 nanoseconds for a period 200 nanoseconds after the last voltage transition of the received MED signals is applied or after the last primary clock pulse is produced. Therefore, if a 300 nanosecond period occurs between voltage transitions of the received MED signals, two clock pulses will be inserted into the output of circuit 10 spaced 100 nanoseconds apart. While variations in the period between clock pulses of the received Manchester clock will be present, such variations will be within the capability of a phase locked loop oscillator to correct in the process of producing a reconstituted Manchester clock as taught in the application entitled "Bidirectional Repeater for Manchester Encoded Data Signals" further identified in the section of this application entitled "Cross Reference to Related Application".

While this invention has been described with reference to illustrated embodiment, the description is for illustrative purposes and is not to be construed as limiting the scope of the invention. Various modifications and changes may occur to those skilled in the art without departing from the true spirit and scope of the invention as defined by the claims hereof.

What is claimed is:

1. A receive Manchester clock circuit to which is applied Manchester encoded data (MED) signals having a basic period, said circuit comprising:
   means for differentiating applied MED signals to produce a primary clock pulse for each voltage transition of the applied MED signals;
   means for producing a secondary clock pulse a first predetermined period of time after each primary pulse is produced;
   means for producing a tertiary clock pulse a second predetermined period of time after each secondary pulse is produced, said first and second predetermined periods of time being substantially equal to one-half the basic period of the applied Manchester encoded data signals; and
   gate means to which the primary, secondary, and tertiary clock pulses are applied for producing a receive Manchester clock pulse in response to a primary, secondary or tertiary clock pulse being applied to said gate means.

2. A receive Manchester clock circuit comprising:
   a differentiating circuit to which received Manchester encoded data signals having a basic frequency are applied for producing a primary clock pulse of a given polarity and predetermined pulse width for each voltage transition of the received Manchester encoded data signals;
   first means for producing for each primary pulse produced by the differentiating circuit, a secondary clock pulse delayed a first predetermined period of time after each primary clock pulse;
   second means for producing for each secondary clock pulse produced by the first means, a tertiary clock pulse delayed a second predetermined period of time with respect to each secondary cock pulse, said first and second predetermined periods of time being substantially equal; and
   gate means to which the primary, secondary, and tertiary clock pulses are applied for producing receive Manchester clock pulses, the frequency of which are substantially twice that of the basic frequency of the received Manchester encoded data signals.

* * * * *